United States Patent [19]
Manning

[11] Patent Number: 5,610,864
[45] Date of Patent: Mar. 11, 1997

[54] BURST EDO MEMORY DEVICE WITH MAXIMIZED WRITE CYCLE TIMING

[75] Inventor: Troy A. Manning, Boise, Id.

[73] Assignee: Micron Technology, Inc., Boise, Id.

[21] Appl. No.: 386,894

[22] Filed: Feb. 10, 1995

Related U.S. Application Data

[63] Continuation-in-part of Ser. No. 370,761, Dec. 23, 1994.

[51] Int. Cl.$^6$ ................................................ G11C 7/00
[52] U.S. Cl. .................... 365/193; 365/233; 365/189.05; 365/189.01
[58] Field of Search .................... 365/233, 193, 365/189.05, 189.01, 230.01

[56] References Cited

U.S. PATENT DOCUMENTS

| | | | |
|---|---|---|---|
| 4,344,156 | 8/1982 | Eaton et al. | 365/203 |
| 4,484,308 | 11/1984 | Lewandowski et al. | 364/900 |
| 4,562,555 | 12/1985 | Ouchi et al. | 365/233 |
| 4,567,579 | 1/1986 | Patel et al. | 365/189 |
| 4,575,825 | 3/1986 | Ozaki et al. | 365/189 |
| 4,603,403 | 7/1986 | Toda | 365/189 |
| 4,618,947 | 10/1986 | Tran et al. | 365/230 |
| 4,649,522 | 3/1987 | Kirsch | 365/189 |
| 4,685,089 | 8/1987 | Patel et al. | 365/233 |
| 4,707,811 | 11/1987 | Takemae et al. | 365/239 |
| 4,788,667 | 11/1988 | Nakano | 365/193 |
| 4,870,622 | 9/1989 | Aria et al. | 365/230 |
| 4,875,192 | 10/1989 | Matsumoto | 365/193 |
| 5,058,066 | 10/1991 | Yu | 365/189.05 |
| 5,126,975 | 6/1992 | Handy et al. | 365/230.01 |
| 5,267,200 | 11/1993 | Tobita | 365/189.05 |
| 5,268,865 | 12/1993 | Takasugi | 365/189.05 |
| 5,280,594 | 1/1994 | Young et al. | 365/230.04 |
| 5,305,284 | 4/1994 | Iwase | 365/238.5 |
| 5,325,330 | 6/1994 | Morgan | 365/189.05 |
| 5,325,502 | 6/1994 | McLaury | 395/425 |
| 5,349,566 | 9/1994 | Merritt et al. | 365/233.5 |
| 5,357,469 | 10/1994 | Sommer et al. | 365/193 |
| 5,373,227 | 12/1994 | Keeth | 323/313 |
| 5,379,261 | 1/1995 | Jones, Jr. | 365/230.01 |
| 5,392,239 | 2/1995 | Margulis et al. | 365/189 |
| 5,410,670 | 4/1995 | Hansen et al. | 395/425 |
| 5,452,261 | 9/1995 | Chung et al. | 365/233 |
| 5,457,659 | 10/1995 | Schaefer | 365/222 |
| 5,526,320 | 6/1996 | Zagar et al. | 365/233.5 |

FOREIGN PATENT DOCUMENTS 19507562  9/1995  Germany.

OTHER PUBLICATIONS

"DRAM 1 Megx4 DRAM 5VEDO Page Mode", *1995 DRAM Data Book*, pp. 1–1 thru 1–30, (Micron Technology, I).

"Rossini, Pentium, PCI–ISA, Chip Set", *Symphony Laboratories*, entire book.

"Hyper Page Mode DRAM", 8029 *Electronic Engineering*, 66, No. 813, Woolwich, London, GB, pp. 47–48, (Sep. 1994).

(List continued on next page.)

*Primary Examiner*—David C. Nelms
*Assistant Examiner*—Vu A. Le
*Attorney, Agent, or Firm*—Schwegman, Lundberg, Woessner & Kluth, P.A.

[57] ABSTRACT

An integrated circuit memory device is designed for high speed data access and for compatibility with existing memory systems. An address strobe signal is used to latch a first address. During a burst access cycle the address is incremented internal to the device with additional address strobe transitions. A new memory address is only required at the beginning of each burst access. Read/Write commands are issued once per burst access eliminating the need to toggle the Read/Write control line at the device cycle frequency. A transition of the Read/Write control line during a burst access is used to terminate the burst access, reset the burst length counter and initialize the device for another burst access. Write cycle times are maximized to allow for increases in burst mode operating frequencies.

20 Claims, 8 Drawing Sheets

OTHER PUBLICATIONS

Dave Bursky, "Novel I/O Options and Innovative Architectures Let DRAMs Achieve SRAM Performance; Fast DRAMS can be swapped for SRAM Caches", *Electronic Design,* vol. 41, No. 15, Cleveland, Ohio, pp. 55–67, (Jul. 22, 1993).

Shiva P. Gowni, et al., "A 9NS, 32K×9, BICMOS TTL Synchronous Cache RAM With Burst Mode Access", *IEEE,* Custom Integrated Circuits Conference, pp. 781–786, (Mar. 3, 1992).

Mosel–Vitelic V53C8257H DRAM Specification Sheet, 20 pgs., Jul. 2, 1994.

Samsung Electronics, "Samsung Synchronous DRAM", Mar. 1993, pp. 1–16.

Oki Electric Ind. Co., Ltd, "Burst DRAM Function & Pinout", 2nd presentation, Item #619, Sep., 1994.

Toshiba, "Pipelined Burst DRAM", Dec. 1994, JEDEC JC–42.3 Hawaii.

Toshiba America Electronic Components, Inc., "Application Specific DRAM, 1994", pp. C–178, C–260, C218.

Micron Semiconductor, Inc., "Synchronous DRAM 2 MEG×8 SDRAM", pp. 2–43 through 2–83.

Toshiba America Electronic Components, Inc., "4M DRAM 1991", pp. A–137–A–159.

Micron Semiconductor, Inc., "1994 DRAM Data Book", entire book.

BURST EDO MEMORY DEVICE WITH MAXIMIZED WRITE CYCLE TIMING

CROSS REFERENCE TO RELATED APPLICATION

This is a continuation-in-part to U.S. patent application Ser. No. 08/370,761, filed Dec. 23, 1994.

FIELD OF THE INVENTION

This invention relates to memory device architectures designed to provide high density data storage with high speed read and write access cycles. This invention relates more specifically to circuits and methods for controlling memory write cycles in burst access memory devices.

BACKGROUND OF THE INVENTION

Dynamic Random Access Memory devices (DRAMs) are among the highest volume and most complex integrated circuits manufactured today. Except for their high volume production, the state of the art manufacturing requirements of these devices would cause them to be exorbitantly priced. Yet, due to efficiencies associated with high volume production, the price per bit of these memory devices is continually declining. The low cost of memory has fueled the growth and development of the personal computer. As personal computers have become more advanced, they in turn have required faster and more dense memory devices, but with the same low cost of the standard DRAM. Fast page mode DRAMs are the most popular standard DRAM today. In fast page mode operation, a row address strobe (/RAS) is used to latch a row address portion of a multiplexed DRAM address. Multiple occurrences of the column address strobe (/CAS) latch multiple column addresses to access data within the selected row. On the falling edge of /CAS an address is latched, and the DRAM outputs are enabled. When /CAS transitions high the DRAM outputs are placed in a high impedance state (tri-state). With advances in the production of integrated circuits, the internal circuitry of the DRAM operates faster than ever. This high speed circuitry has allowed for faster page mode cycle times. A problem exists in the reading of a DRAM when the device is operated with minimum fast page mode cycle times. /CAS may be low for as little as 15 nanoseconds, and the data access time from /CAS to valid output data (tCAC) may be up to 15 nanoseconds; therefore, in a worst case scenario there is no time to latch the output data external to the memory device. For devices that operate faster than the specifications require, the data may still only be valid for a few nanoseconds. On a heavily loaded microprocessor memory bus, trying to latch an asynchronous signal that is valid for only a few nanoseconds is very difficult. Even providing a new address every 35 nanoseconds requires large address drivers which create significant amounts of electrical noise within the system.

There is a demand for faster, higher density, random access memory integrated circuits which provide a strategy for integration into today's personal computer systems. In an effort to meet this demand, numerous alternatives to the standard DRAM architecture have been proposed. One method of providing a longer period of time when data is valid at the outputs of a DRAM without increasing the fast page mode cycle time is called Extended Data Out (EDO) mode. In an EDO DRAM the data lines are not tri-stated between read cycles in a fast page mode operation. Instead, data is held valid after /CAS goes high until sometime after the next /CAS low pulse occurs, or until /RAS or the output enable (/OE) goes high. Determining when valid data will arrive at the outputs of a fast page mode or EDO DRAM can be a complex function of when the column address inputs are valid, when /CAS falls, the state of /OE and when /CAS rose in the previous cycle. The period during which data is valid with respect to the control line signals (especially /CAS) is determined by the specific implementation of the EDO mode, as adopted by the various DRAM manufacturers.

Methods to shorten memory access cycles tend to require additional circuitry, additional control pins and nonstandard device pinouts. The proposed industry standard synchronous DRAM (SDRAM)for example has an additional pin for receiving a system clock signal. Since the system clock is connected to each device in a memory system, it is highly loaded, and it is always toggling circuitry in every device. SDRAMs also have a clock enable pin, a chip select pin and a data mask pin. Other signals which appear to be similar in name to those found on standard DRAMs have dramatically different functionality on a SDRAM. The addition of several control pins has required a deviation in device pinout from standard DRAMs which further complicates design efforts to utilize these new devices. Significant amounts of additional circuitry are required in the SDRAM devices which in turn result in higher device manufacturing costs.

It is desirable to design and manufacture a memory device having a standard DRAM pinout and a burst mode of operation where multiple data values can be sequentially written to or read from the device in response to a single address location and multiple access strobes. It is also desirable that this new memory device operate at higher frequencies than standard DRAMs.

There is a problem in performing write cycles at high frequencies. In a standard DRAM device, write cycles are performed in response to both /CAS and /WE being low after /RAS is low. Data to be written is latched, and the write cycle begins when the latter of /CAS and /WE goes low. In order to allow for maximum page mode operating frequencies, the write cycle is often timed out so that it can continue for a short period of time after /CAS goes high especially for "late write" cycles. Maintaining the write cycle throughout the timeout period eases the timing specifications for /CAS and /WE that the device user must meet, and reduces susceptibility to glitches on the control lines during a write cycle. The write cycle is terminated after the time out period, and if /WE is high a read access begins based on the address present on the address input lines. The read access will typically begin prior to the next /CAS falling edge so that the column address to data valid specification can be met (tAA). In order to begin the read cycle as soon as possible, it is desirable to minimize the write cycle time while guaranteeing completion of the write cycle. Minimizing the write cycle duration in turn minimizes the margin to some device operating parameters despite the speed at which the device is actually used. Circuits to model the time required to complete the write cycle typically provide an estimate of the time required to write an average memory cell. While it is desirable to minimize the write cycle time, it is also necessary to guarantee that enough time is allowed for the write to complete, so extra delay is added making the write cycle slightly longer than required. Throughout the memory device product lifetime, manufacturing process advances, and circuit enhancements often allow for increases in device operating frequencies. The write cycle timing circuits may need to be adjusted to shorten the minimum write cycle times to match these performance improvements. Fine tuning of these timing circuits is time consuming and costly. If the write cycles are too short, the device may fail under some or all operating conditions. If the write cycles are too long, the device may not be able to achieve the higher operating frequencies that are more profitable for the device manufacturers.

With the increased operating frequencies of burst access memory devices a new method of generating the write cycle timing is desired which will allow for maximum write cycle times despite the operating frequency of the device.

SUMMARY OF THE INVENTION

An integrated circuit memory device with a standard DRAM pinout is designed for high speed data access and for compatibility with existing memory systems. A high speed burst mode of operation is provided where multiple sequential accesses occur following a single column address, and read data is output relative to the /CAS control signal. In the burst mode of operation the address is incremented internal to the device eliminating the need for external address lines to switch at high frequencies. Read/Write commands are issued once per burst access eliminating the need to toggle the Read/Write control line at high speeds. Only one control line per memory chip (/CAS) must toggle at the operating frequency in order to clock the internal address counter and the data input/output latches. The load on each /CAS is typically less than the load on the other control signals (/RAS, /WE and /OE) since each /CAS typically controls only a byte width of the data bus. A new write cycle timing method and circuit allow for maximized write cycle timing at all operating frequencies to provide maximum write cycle timing margins. Write control is maintained throughout a write cycle such that the write operation time approaches the write cycle time. The write function is only halted between write cycles for a period of time required to select a new column of the array. Devices which fail write cycle tests at high speed may then be re-tested for functionality at a lower speed grade where the write cycle will be longer.

BRIEF DESCRIPTION OF THE DRAWINGS

The features of the invention as well as objects and advantages are best understood by reference to the appended claims, detailed description of particular embodiments and accompanying drawings where:

DETAILED DESCRIPTION OF THE PREFERRED EMBODIMENTS

Figure 1:
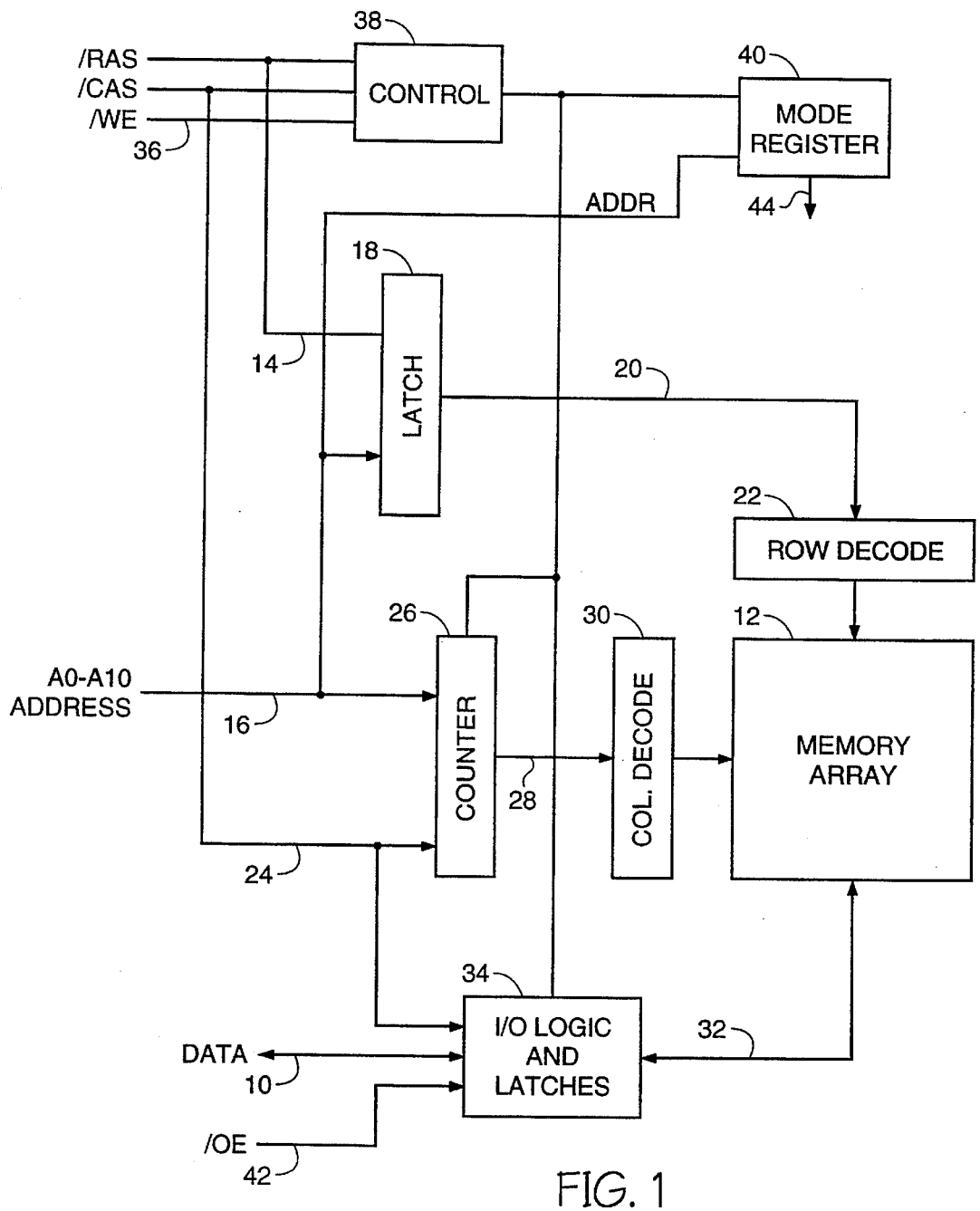
FIG. 1 is an electrical schematic diagram of a memory device in accordance with one embodiment of the invention.

FIG. 1 is a schematic representation of a sixteen megabit device designed in accordance with the present invention. The device is organized as a 2 Meg×8 burst EDO DRAM having an eight bit data input/output path 10 providing data storage for 2,097,152 bytes of information in the memory array 12. The device of FIG. 1 has an industry standard pinout for eight bit wide EDO DRAMs. An active-low row address strobe (/RAS) signal 14 is used to latch a first portion of a multiplexed memory address, from address inputs A0 through A10 16, in latch 18. The latched row address 20 is decoded in row decoder 22. The decoded row address is used to select a row of the memory array 12. A column address strobe (/CAS) signal 24 is used to latch a second portion of a memory address from address inputs 16 into column address counter 26. The latched column address 28 is decoded in column address decoder 30. The decoded column address is used to select a column of the memory array 12.

In a burst read cycle, data within the memory array located at the row and column address selected by the row and column address decoders is read out of the memory array and sent along data path 32 to output latches 34. Data 10 driven from the burst EDO DRAM may be latched external to the device in synchronization with /CAS after a predetermined number of /CAS cycle delays (latency). For a two cycle latency design, the first /CAS falling edge is used to latch the initial address for the burst access. The first burst data from the memory is driven from the memory after the second /CAS falling edge, and remains valid through the third /CAS falling edge. Once the memory device begins to output data in a burst read cycle, the output drivers 34 continue to drive the data lines without tri-stating the data outputs during /CAS high intervals dependent on the state of the output enable and write enable (/OE and /WE) control lines, thus allowing additional time for the system to latch the output data. Once a row and a column address are selected, additional transitions of the /CAS signal are used to advance the column address within the column address counter in a predetermined sequence. The time at which data becomes valid at the outputs of the burst EDO DRAM is dependent only on the timing of the /CAS signal provided that /OE is maintained low, and /WE remains high. The output data signal levels may be driven in accordance with standard CMOS, TTL, LVTTL, GTL, or HSTL output level specifications.

The address may be advanced linearly, or in an interleaved fashion for maximum compatibility with the overall system requirements. The column address may be advanced with each /CAS transition, each pulse, or multiple of /CAS pulses in the event that more than one data word is read from the array with each column address. When the address is advanced with each transition of the /CAS signal, data is also driven from the part after each transition following the device latency which is then referenced to each edge of the /CAS signal. This allows for a burst access cycle where the highest switching control line (/CAS) toggles only once (high to low or low to high) for each memory cycle. This is in contrast to standard DRAMs which require /CAS to go low and then high for each cycle, and synchronous DRAMs which require a full clock cycle (high and low transitions) for each memory cycle. For maximum compatibility with existing EDO DRAM devices, the invention will be further described in reference to a device designed to latch and advance a column address on falling edges of the /CAS signal.

It may be desirable to latch and increment the column address after the first /CAS falling edge in order to apply both the latched and incremented addresses to the array at the earliest opportunity in an access cycle. For example, a device may be designed to access two data words per cycle (prefetch architecture). The memory array for a prefetch architecture device may be split into odd and even array halves. The column address least significant bit is used to select between odd and even halves while the other column address bits select a column within each of the array halves. In an interleaved access mode with column address 1, data from columns 0 and 1 are read and the data from column 1 is output followed by the data from column 0 in accordance with standard interleaved addressing as described in SDRAM specifications. In a linear access mode column address 1 is applied to the odd array half, and incremented to address 2 for accessing the even array half to fulfill the two word access. One method of implementing this type of device architecture is to provide a column address incrementing circuit between the column address counter and the even array half. The incrementing circuit increments the column address only if the initial column address in a burst access cycle is odd, and the address mode is linear. Otherwise the incrementing circuit passes the column address unaltered. For a design using a prefetch of two data accesses per cycle, the column address is advanced once for every two active edges of the /CAS signal. In a write cycle, multiple data words may be temporarily stored as they are input to the device. The actual write of data to the memory cells occurs after the last input data is latched, and may extend slightly into the next memory cycle as long as it ends prior to the next column being activated. Prefetch architectures where more than two data words are accessed are also possible.

Other memory architectures applicable to the current invention include a pipelined architecture where memory accesses are performed sequentially, but each access requires more than a single cycle to complete. In a pipelined architecture the overall throughput of the memory approaches one access per cycle, but the data out of the memory is offset by a number of cycles equal to the pipeline length and/or the desired latency from /CAS.

In the burst access memory device, each new column address from the column address counter is decoded and is used to access additional data within the memory array without the requirement of additional column addresses being specified on the address inputs 16. This burst sequence of data continues for each /CAS falling edge until a predetermined number of data accesses equal to the burst length occurs. A /CAS falling edge received after the last burst address has been generated latches another column address from the address inputs 16 and a new burst sequence begins. Read data is latched and output with each falling edge of /CAS after the first /CAS latency.

For a burst write cycle, data 10 is latched in input data latches 34. Data targeted at the first address specified by the row and column addresses is latched with the /CAS signal when the first column address is latched (write cycle data latency is zero). Other write cycle data latency values are possible; however, for today's memory systems, zero is preferred. Additional input data words for storage at incremented column address locations are latched by /CAS on successive /CAS pulses. Input data from the input latches 34 is passed along data path 32 to the memory array where it is stored at the location selected by the row and column address decoders. As in the burst read cycle previously described, a predetermined number of burst access writes are performed without the requirement of additional column addresses being provided on the address lines 16. After the predetermined number of burst writes occurs, a subsequent /CAS pulse latches a new beginning column address, and another burst read or write access begins.

The memory device of FIG. 1 may include the option of switching between burst EDO and standard EDO modes of operation. In this case, the write enable signal /WE 36 is used at the row address latch time (/RAS falling, /CAS high) to determine whether memory accesses for that row are burst or page mode cycles. If /WE is low when /RAS falls, burst access cycles are selected. If /WE is high at /RAS falling, standard extended data out (EDO) page mode cycles are selected. Both the burst and EDO page mode cycles allow for increased memory device operating frequencies by not requiring the data output drivers 334 to place the data lines 10 in a high impedance state between data read cycles while /RAS is low. DRAM control circuitry 38, in addition to performing standard DRAM control functions, controls the I/O circuitry 34 and the column address counter/latch 26 in accordance with the mode selected by /WE when /RAS falls. In a burst mode only DRAM, or in a device designed with an alternate method of switching between burst and non-burst access cycles, the state of /WE when /RAS falls may be used to switch between other possible modes of operation such as interleaved versus linear addressing modes.

The write enables signal is used in burst access cycles to select read or write burst accesses when the initial column address for a burst cycle is latched by /CAS. /WE low at the column address latch time selects a burst read access. /WE high at the column address latch time selects a burst read access. The level of the /WE signal must remain high for read and low for write burst accesses throughout the burst access. A low to high transition within a burst write access terminates the burst access, preventing further writes from occurring. A high to low transition on /WE within a burst read access likewise terminates the burst read access and places the data output 10 in a high impedance state. Transitions of the /WE signal may be locked out during critical timing periods within an access cycle in order to reduce the possibility of triggering a false write cycle, and/or to guarantee the completion of a write cycle once it has begun. After the critical timing period the state of /WE determines whether a burst access continues, is initiated, or is terminated. Termination of a burst access resets the burst length counter and places the DRAM in a state to receive another burst access command. Both /RAS and /CAS going high during a burst access also terminate the burst access cycle placing the data drivers in a high impedance output state, and resetting the burst length counter. Read data may remain valid at the device outputs if /RAS alone goes high while /CAS is active for compatibility with hidden refresh cycles, otherwise /RAS high alone may be used to terminate a burst access. A minimum write enable pulse width is only required when it is desired to terminate a burst read and then begin another burst read, or terminate a burst write prior to performing another burst write with a minimum delay between burst accesses. In the case of burst reads, /WE transitions from high to low to terminate a first burst read, and then /WE transitions back high prior to the next falling edge of /CAS in order to specify a new burst read cycle. For burst writes, /WE transitions high to terminate a current burst write access, then back low prior to the next falling edge of /CAS to initiate another burst write access.

A basic implementation of the device of FIG. 1 may include a fixed burst length of 4, a fixed /CAS latency of 2 and a fixed interleaved sequence of burst addresses. This basic implementation requires very little additional circuitry to the standard EDO page mode DRAM, and may be mass produced to provide the functions of both the standard EDO page mode and burst EDO DRAMs. This device also allows for the output enable pin (/OE) to be grounded for compatibility with many SIMM module designs. When not disabled (tied to ground), /OE is an asynchronous control which prevents data from being driven from the part in a read cycle if it is inactive (high) prior to /CAS falling and remains inactive beyond /CAS rising. If these setup and hold conditions are not met, then the read data may be driven for a portion of the read cycle. It is possible to synchronize the /OE signal with /CAS, however this typically increases the /CAS to data valid delay time and doesn't allow for the read data to be disabled prior to /RAS high without an additional /CAS low pulse which would otherwise be unnecessary. In a preferred embodiment, if /OE transitions high at any time during a read cycle the outputs remain in a high impedance state until the next falling edge of /CAS despite further transitions of the /OE signal.

Programmability of the burst length, /CAS latency and address sequences may be accomplished through the use of a mode register 40 which latches the state of one or more of the address input signals 16 or data signals 10 upon receipt of a write-/CAS-before-/RAS (WCBR) programming cycle. In such a device, outputs 44 from the mode register control the required circuits on the DRAM. Burst length options of 2, 4, 8 and full page as well as /CAS latencies of 1, 2 and 3 may be provided. Other burst length and latency options may be provided as the operating speeds of the device increase, and computer architectures evolve. The device of FIG. 1 includes programmability of the address sequence by latching the state of the least significant address bit during a WCBR cycle. The burst length and /CAS latency for this particular embodiment are fixed. Other possible alterations in the feature sets of this DRAM include having a fixed burst mode only, selecting between standard fast page mode (non-EDO) and burst mode, and using the output enable pin (/OE) 42 in combination with /RAS to select between modes of operation. Also, a WCBR refresh cycle could be used to select the mode of operation rather than a control signal in combination with /RAS. A more complex memory device may provide additional modes of operation such as switching between fast page mode, EDO page mode, static column mode and burst operation through the use of various combinations of /WE and /OE at /RAS falling time. One mode from a similar set of modes may be selected through the use of a WCBR cycle using multiple address or data lines to encode the desired mode. Alternately, a device with multiple modes of operation may have wire bond locations, or programmable fuses which may be used to program the mode of operation of the device.

A preferred embodiment of a sixteen bit wide burst EDO mode DRAM designed in accordance with the teachings of this invention has two column address strobe input pins /CASH and /CASL. For read cycles only one /CAS signal needs to toggle. The second /CAS may remain high or toggle with the other /CAS. During burst read cycles, all sixteen data bits will be driven out of part during a read cycle even if one /CAS remains inactive. In a typical system application, a microprocessor reads all data bits on a data bus in each read cycle, but may only write certain bytes of data in a write cycle. Allowing one of the /CAS control signals to remain static during read cycles helps to reduce overall power consumption and noise within the system. For burst write access cycles, each of the /CAS signals (CASH and /CASL) acts as a write enable for an eight bit width of the data. The two /CAS's are combined in an AND function to provide a single internal /CAS which will go low when the first external /CAS falls, and returns high after the last external /CAS goes high. All sixteen data inputs are latched when the first of the /CAS signals transitions low. If only one /CAS signal transitions low, then the eight bits of data associated with the /CAS that remained high are not stored in the memory.

The present invention has been described with reference to several preferred embodiments. Just as fast page mode DRAMs and EDO DRAMs are available in numerous configurations including ×1, ×4, ×8 and ×16 data widths, and 1 Megabit, 4 Megabit, 16 Megabit and 64 Megabit densities; the memory device of the present invention may take the form of many different memory organizations. It is believed that one who is skilled in the art of integrated circuit memory design can, with the aide of this specification design a variety of memory devices which do not depart from the spirit of this invention. It is therefore believed that detailed descriptions of the various memory device organizations applicable to this invention are not necessary.

It should be noted that the pinout for this new burst EDO memory device may be identical to the pinout for a standard EDO DRAM. The common pinout allows this new device to be used in existing memory designs with minimum design changes. The common pinout also allows for ease of new designs by those of skill in the art who are familiar with the standard EDO DRAM pinout. Variations of the described invention which maintain the standard EDO DRAM pinout include driving the /CAS pin with a system clock signal to synchronize data access of the memory device with the system clock. For this embodiment, it may be desirable to use the first /CAS active edge after /RAS falls to latch the row address, a later edge may be used to latch the first column address of a burst access cycle. After row and column addresses are latched within the device, the address may be incremented internally to provide burst access cycles in synchronization with the system clock. Other pin function alternatives include driving the burst address incrementing signal on the /OE pin since the part does not require a data output disable function on this pin. Other alternate uses of the /OE pin also allow the device to maintain the standard EDO pinout, but provide increased functionality such as burst mode access. The /OE pin may be used to signal the presence of a valid column starting address, or to terminate a burst access. Each of these embodiments provides for a high speed burst access memory device which may be used in current memory systems with a minimum amount of redesign.

Figure 2:
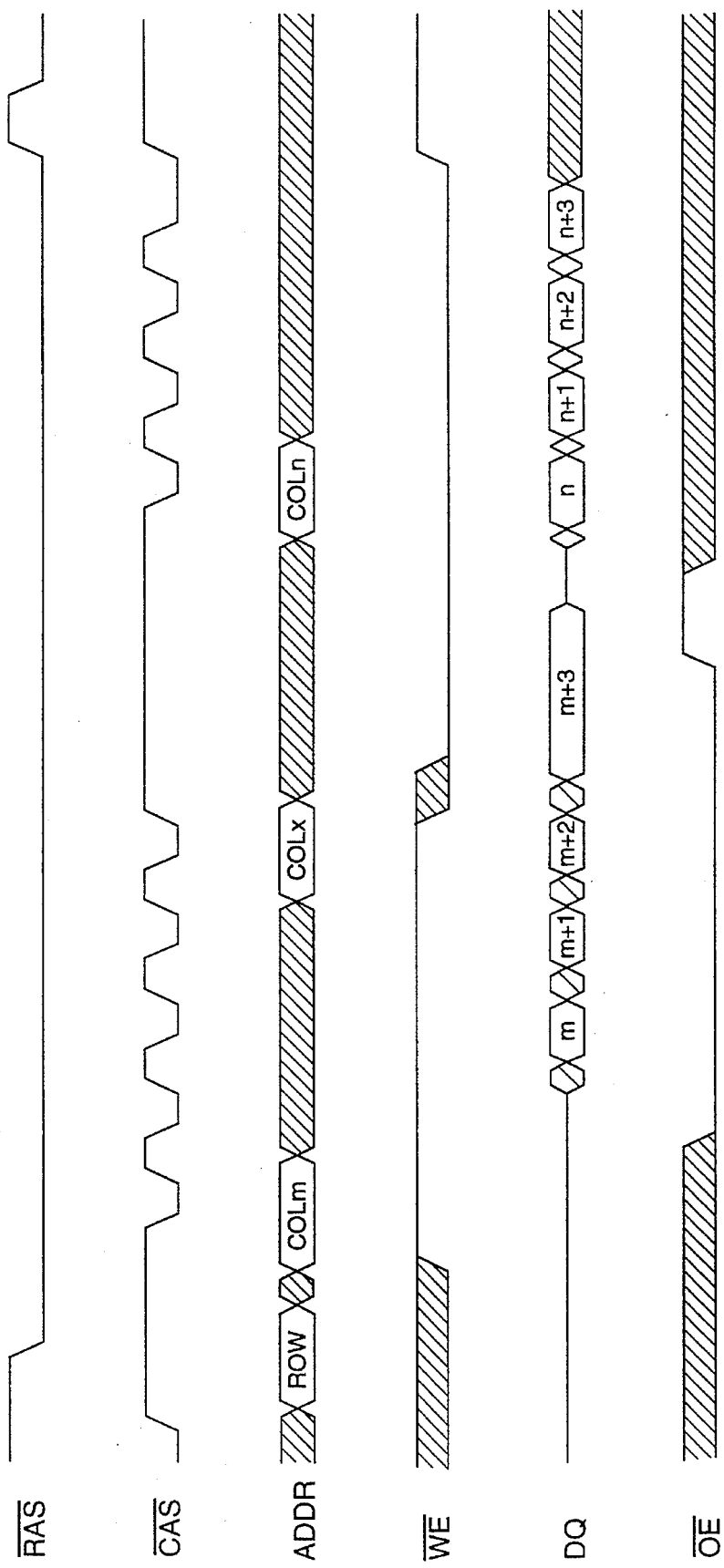
FIG. 2 is a timing diagram for a method of accessing the device of FIG. 1.

FIG. 2 is a timing diagram for performing a burst read followed by a burst write of the device of FIG. 1. In FIG. 2, a row address is latched by the /RAS signal. /WE is low when /RAS falls for an embodiment of the design where the state of the /WE pin is used to specify a burst access cycle at /RAS time. Next, /CAS is driven low with /WE high to initiate a burst read access, and the column address is latched. The data out signals (DQ's) are not driven in the first /CAS cycle. On the second falling edge of the /CAS signal, the internal address generation circuitry advances the column address and begins another access of the array, and the first data out is driven from the device after a /CAS to data access time (tCAC). Additional burst access cycles continue, for a device with a specified burst length of four, until the fifth falling edge of /CAS which latches a new column address for a new burst read access. /WE falling in the fifth /CAS cycle terminates the burst access, and initializes the device for additional burst accesses. The sixth falling edge of /CAS with /WE low is used to latch a new burst address, latch input data and begin a burst write access of the device. Additional data values are latched on successive /CAS falling edges until /RAS rises to terminate the burst access.

It should be noted from FIG. 2 that for burst read cycles the data remains valid on the device outputs as long as the /OE pin is low, except for brief periods of data transition. Also, since the /WE pin is low prior to or when /CAS falls, the data input/output lines are not driven from the part during write cycles, and the /OE pin is a "don't care". Only the /CAS signal and the data signals toggle at relatively high frequency, and no control signals other than /CAS are required to be in an active or inactive state for one /CAS cycle time or less. This is in contrast to SDRAMs which often require row address strobes, column address strobes, data mask, and read/write control signals to be valid for one clock cycle or less for various device functions. Typical DRAMs also allow for the column address to propagate through to the array to begin a data access prior to /CAS falling. This is done to provide fast data access from /CAS falling if the address has been valid for a sufficient period of time prior to /CAS falling for the data to have been accessed from the array. In these designs an address transition detection circuit is used to restart the memory access if the column address changes prior to /CAS falling. This method actually requires additional time for performing a memory access since it must allow for a period of time at the beginning of each memory cycle after the last address transition to prepare for a new column address. Changes in the column address just prior to /CAS falling may increase the access time by approximately five nanoseconds. An embodiment of the present invention will not allow the column address to propagate through to the array until after /CAS has fallen. This eliminates the need for address transition detection circuitry, and allows for a fixed array access time relative to /CAS.

Figure 3:
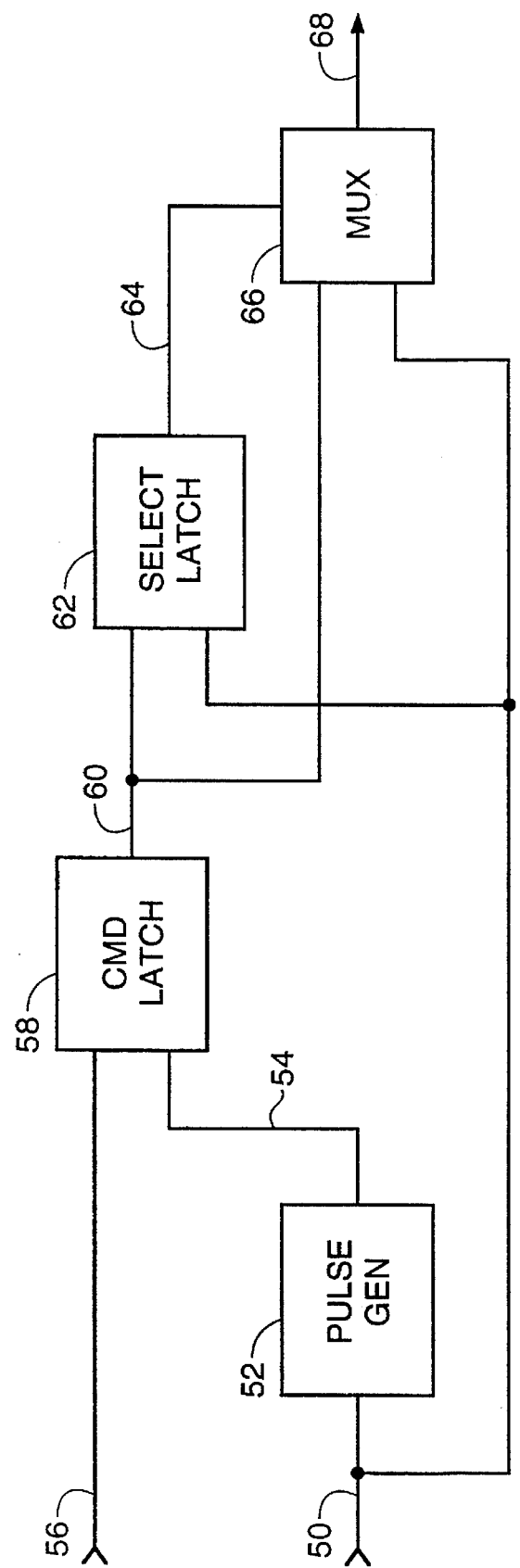
FIG. 3 is a schematic diagram of a portion of a memory device in accordance with the present invention.

FIG. 3 shows a write timing circuit designed to maximize the amount of time allowed for each write cycle to complete regardless of the device operating frequency. An access cycle strobe signal node 50 is connected to a pulse generator 52. For the purposes of this specification a node may be, but is not limited to, an intersection of conductors, a circuit input or output, or any point along a signal path. At the beginning of each access cycle, the pulse generator produces a pulse signal on signal line 54 in response to an access cycle strobe signal on node 50. A read/write command signal on line 56 is an input to a command latch 58. Upon receipt of an access cycle strobe, the pulse signal clears the command latch. The read/write command on line 56 is latched in the command latch, after the latch is cleared. The read/write command remains latched until the next pulse signal occurs on line 54 clearing the command latch. A latched read/write control signal on line 60 from the command latch goes to a write control select latch 62. The select latch output is connected to a multiplexer select signal line 64 for selecting whether the latched read/write control signal or the access cycle strobe signal controls a data path to allow data to be written into memory. When the select signal 64 is in one state, the read/write control signal will pass through the multiplexer 66 to the write control signal 68. When the select 64 is in a second state, the access cycle strobe signal will pass through the multiplexer to the write control signal 68.

At the beginning of each cycle, the latched read/write control signal is cleared. The cleared read/write control signal causes the multiplexer select signal to select the read/write control signal on line 60. Whenever the latched command indicates that a read cycle is being performed, the select signal continues to select the signal on line 60 throughout the access cycle. For write cycles, after the pulse signal clears the command latch, the latched read/write control signal indicates that a write cycle is being performed. This signal is selected to pass through the multiplexer and initiate a write cycle by driving the write control signal 68. When the access cycle strobe signal changes state, the write control select latch causes the multiplexer select signal to change states and select the access cycle strobe signal to pass through the multiplexer to maintain the write control signal on signal line 68. At the beginning of the next cycle, the access cycle strobe signal again changes state and passes through the multiplexer to terminate the write cycle. The pulse generator produces a pulse signal to clear the command latch, and the select signal changes state to select the read/write control signal to pass through the multiplexer. In this manner, the write control signal is valid for a period of time approximately equal to a cycle time. The write control signal enables data from the input data latches to be applied to memory array for storage at the address specified by row and column address decoders. Data from the input data latches must be applied to a memory element for a minimum amount of time to ensure that a full data level will be stored in the memory element. By enabling the data path for nearly a full cycle time, the amount of time that data is applied to the memory is maximized at all operating frequencies.

Figure 4:
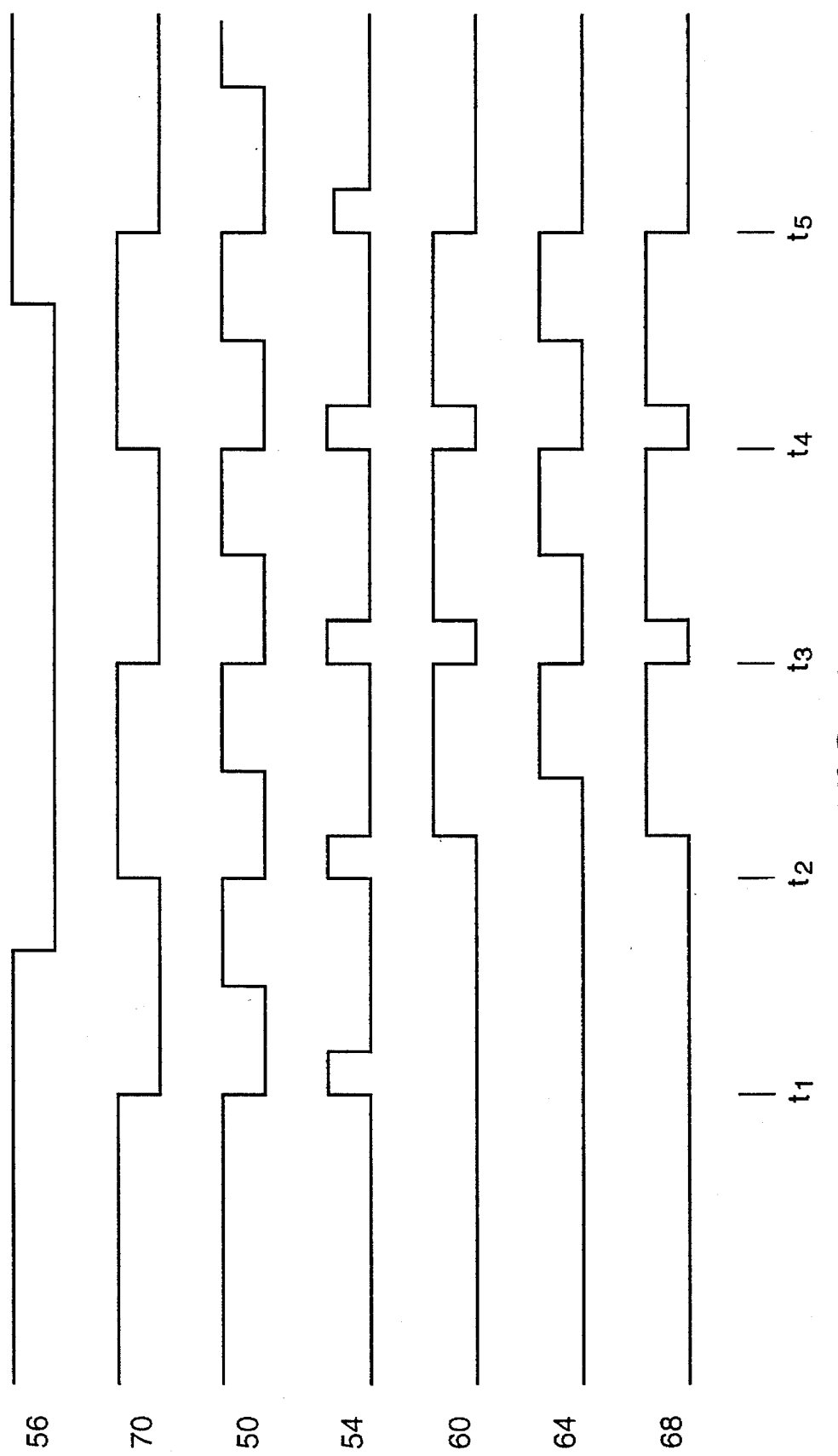
FIG. 4 is a timing diagram of the operation of the circuit of FIG. 3.

The operation of the circuit of FIG. 3 is further described in the timing diagram of FIG. 4. Signals are labeled according to the signal lines on which they are generated from the circuit of FIG. 3. Circuit initialization will occur at the beginning of each access cycle in response to an access cycle strobe signal active edge. In one embodiment of the circuit of FIG. 3, the access cycle strobe signal is a column address strobe (/CAS) for a burst mode DRAM as described in the present invention, and a new cycle begins with each falling edge of /CAS in a burst access. After initialization, a write cycle operation will begin in response to the latched read/write control signal. The write operation will continue until the end of the access cycle (the beginning of a subsequent access). Once the next cycle is begun, a new column will be selected as fast as possible. Rapid termination of the write cycle is important to prevent data at the next column address from being disturbed. By selecting the access cycle strobe signal, the write operation may be rapidly terminated at the beginning of the next cycle without waiting for the command latch to be cleared. The timing diagram of FIG. 4 shows a read cycle followed by three write cycles and then another read cycle. A read access begins at time t1. Signal 56 being high in this embodiment signifies a read access. Once the access cycle strobe signal 50 transitions high, a read state on the read/write command signal is latched in the command latch which generates the latched read/write control signal. The transition to a write command on the read/write command signal line 56 is ignored until time t2. At time t2 a write cycle begins. After the signal pulse on line 54, a write state of the read/write command is latched on signal line 60 until it is cleared by the next signal pulse on line 54 at time t3. For each write cycle, the latched read/write control signal passes through the multiplexer to line 68. The select line 64 switches during each write cycle after the access cycle strobe signal has transitioned high, causing the multiplexer to select the access cycle strobe signal. At the beginning of the next cycle, the access cycle strobe signal transitions low terminating the write, clearing the command latch and resetting the select signal. For burst write access cycles, the write control signal on line 68 is active for a period of time approaching an access cycle time despite the operating frequency of the memory device. The write control signal is only cleared between burst write cycles for a period of time required to select a new column of the memory array. At time 15, a read cycle begins. The command latch and select line are cleared, and the select line remains low for the read cycle.

Figure 5:
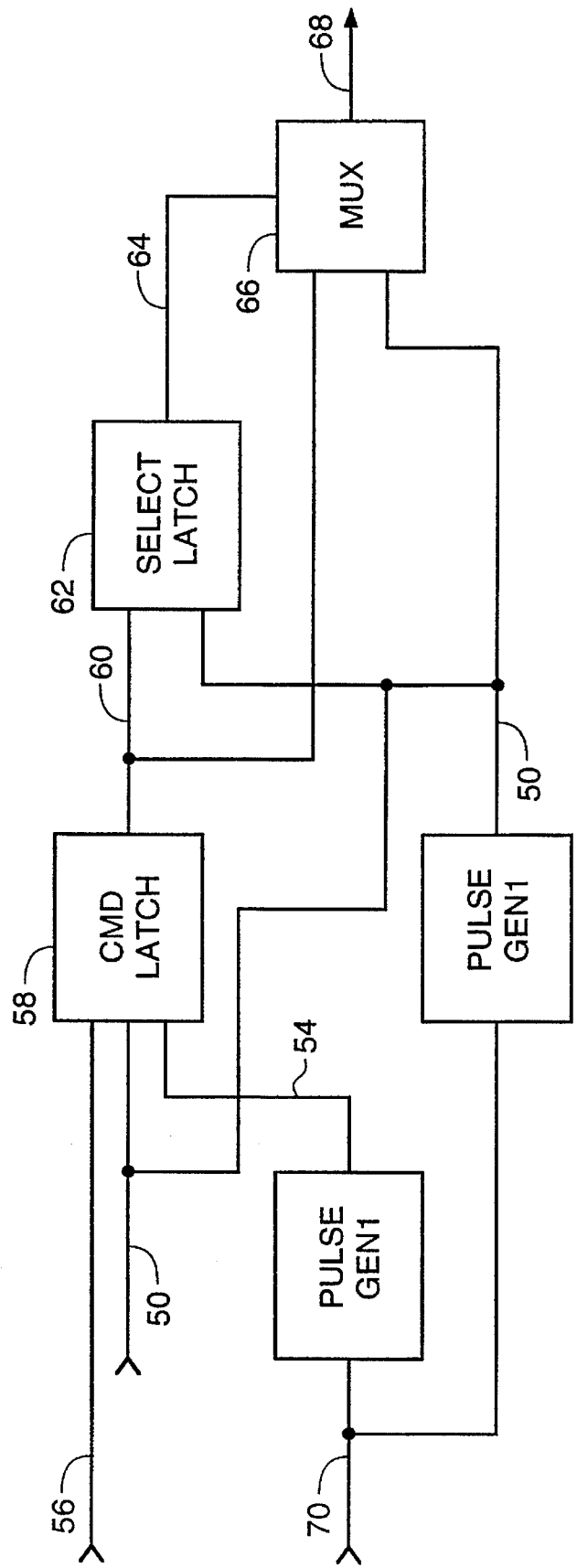
FIG. 5 is a schematic diagram of an alternate embodiment of the circuit of FIG. 3.

FIG. 5 shows an alternate embodiment of the circuit of FIG. 3. In the embodiment of the invention shown in FIG. 5, the memory device is designed to initiate an access cycle after each edge of an access cycle signal (typically /CAS). For this situation, the pulse generator 52 generates a short pulse after each transition of /CAS on line 70. A second pulse generator 72 is placed between signal line 70 and signal line 50 to generate a longer pulse after each transition of /CAS. This longer pulse becomes the access strobe signal 50 as shown in the timing diagram of FIG. 4. The other components of FIG. 5 operate as described for like numbered components of FIG. 3. The timing of the /CAS signal for this design is shown in FIG. 4 as signal 70.

Figure 6:
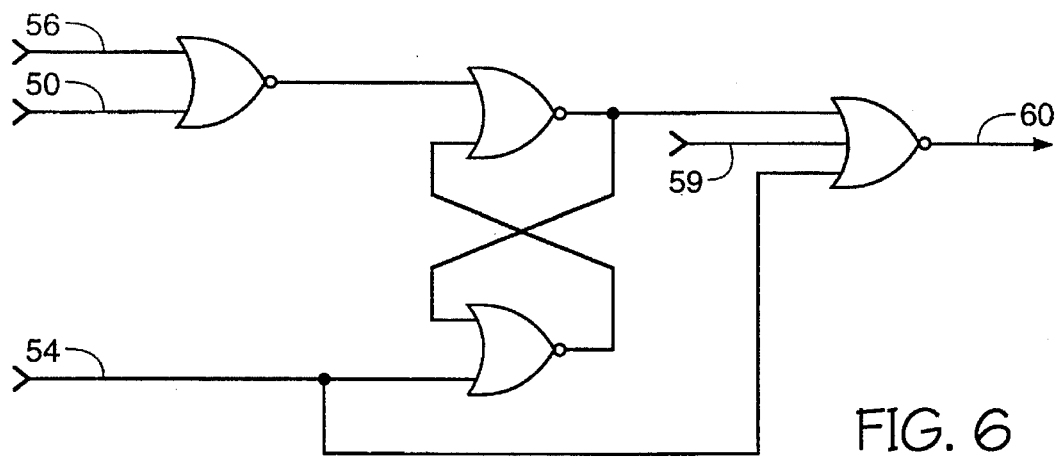
FIG. 6 is a schematic diagram of a portion of the circuitry of FIGS. 1, 3.

FIG. 6 shows an example embodiment of command latch 58. A high pulse on signal line 54 at the beginning of each access will force signal line 60 to go low clearing the latch. Also, if the read/write command signal 56 is low indicating a write cycle at the same time that the access cycle strobe signal 50 is low, signal line 60 will go high after the signal pulse on line 54, and will be latched high once the access cycle strobe signal returns high. In addition to the signal pulse clearing the write command, /RAS 59 going high forces signal line 60 to go low clearing the latched write control. An additional write command latch (not shown) may be used to latch a burst access termination as a result of a transition on the read/write control signal since the command latch 58 does not recognize transitions on the read/write command signal line while it is in a latched state.

Figure 7:
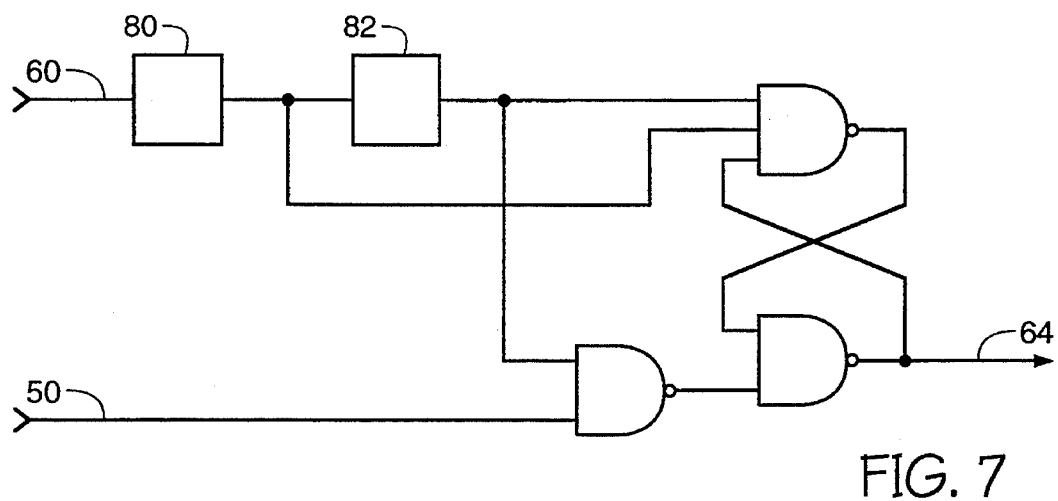
FIG. 7 is a schematic diagram of a further portion of the circuitry of FIGS. 1, and 5.

FIG. 7 shows an example embodiment of the select latch 62. A first delay element 80 guarantees that the latched read/write control signal 60 is cleared prior to unlatching the select signal 64. When a write cycle is terminated at the beginning of a subsequent access cycle, signal 50 will transition low. Signal 60 will go low shortly afterwards, and the output of the select latch will go low. A second delay element 82 ensures that the latch remains cleared until a new command has been latched in the command latch.

Figure 8:
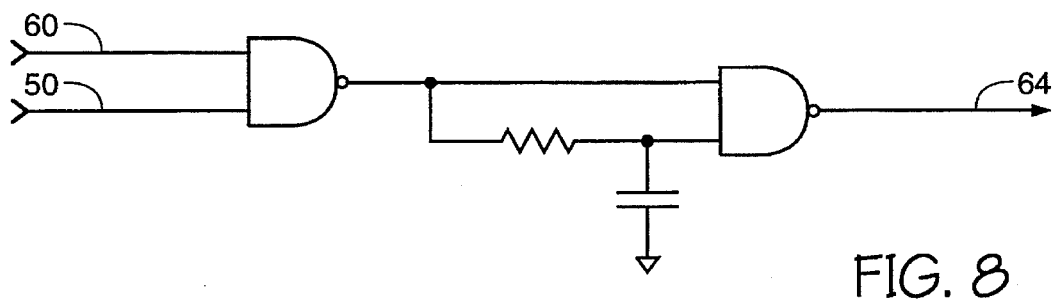
FIG. 8 is a schematic diagram of yet a further portion of the circuitry of FIGS. 1, 3 and 5.

It may be possible to replace the latch of FIG. 7 with an AND function and a is delay as shown in FIG. 8. In this circuit, if the latched read/write control is high (write command) when the access cycle strobe goes high, the select line will switch to allow the access cycle to terminate the write at the beginning of the next cycle. When the next cycle begins, signal 50 will transition low, and the delay circuitry comprising a resistor and a capacitor will prevent the select signal from transitioning back before the command latch is cleared.

Figure 9:
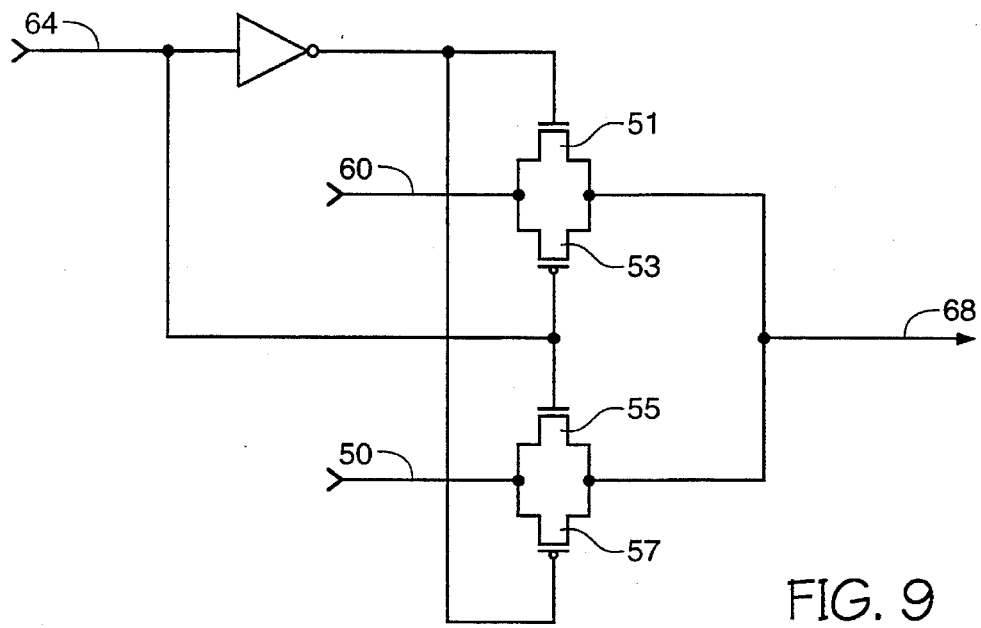
FIG. 9 is a schematic diagram of still a further portion of the circuitry of FIGS. 1, 3 and 5.

FIG. 9 shows an embodiment of a fast multiplexer circuit 66 for the circuits of FIGS. 3 and 5. Select line 64 determines whether signal 50 or 60 will pass through the CMOS transistors 51, 53, 55, and 57 to signal line 68.

Figure 10:
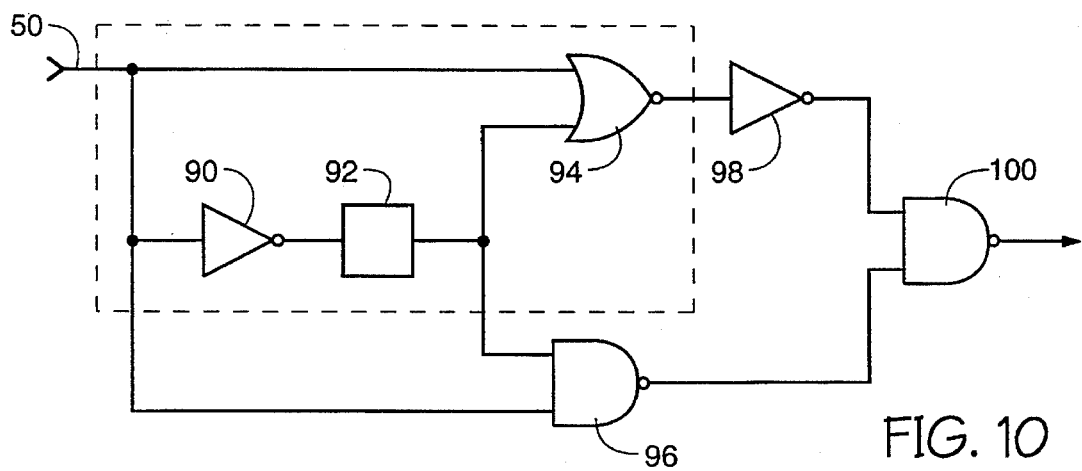
FIG. 10 is a schematic diagram of yet still a further portion of the circuitry of FIGS. 1, 3 and 5.

FIG. 10 shows an embodiment of the pulse generators of FIGS. 3 and 5. An inverter 90, a delay element 92 and a NOR gate 94 serve as the high pulse generator 52 of FIG. 3 which will generate a high pulse for each low transition on signal line 50. For the two pulse generators of FIG. 5 which require a pulse in response to each transition on signal line 50, inverter 98 converts the high pulse from NOR gate 94 into a low pulse, and NAND gate 96 generates a low pulse in response to high transitions on signal line 50. NAND gate 100 combines and inverts the outputs of the high and low edge pulse generators to provide a single high pulse signal in response to a high or a low transition on signal line 50.

Figure 11:
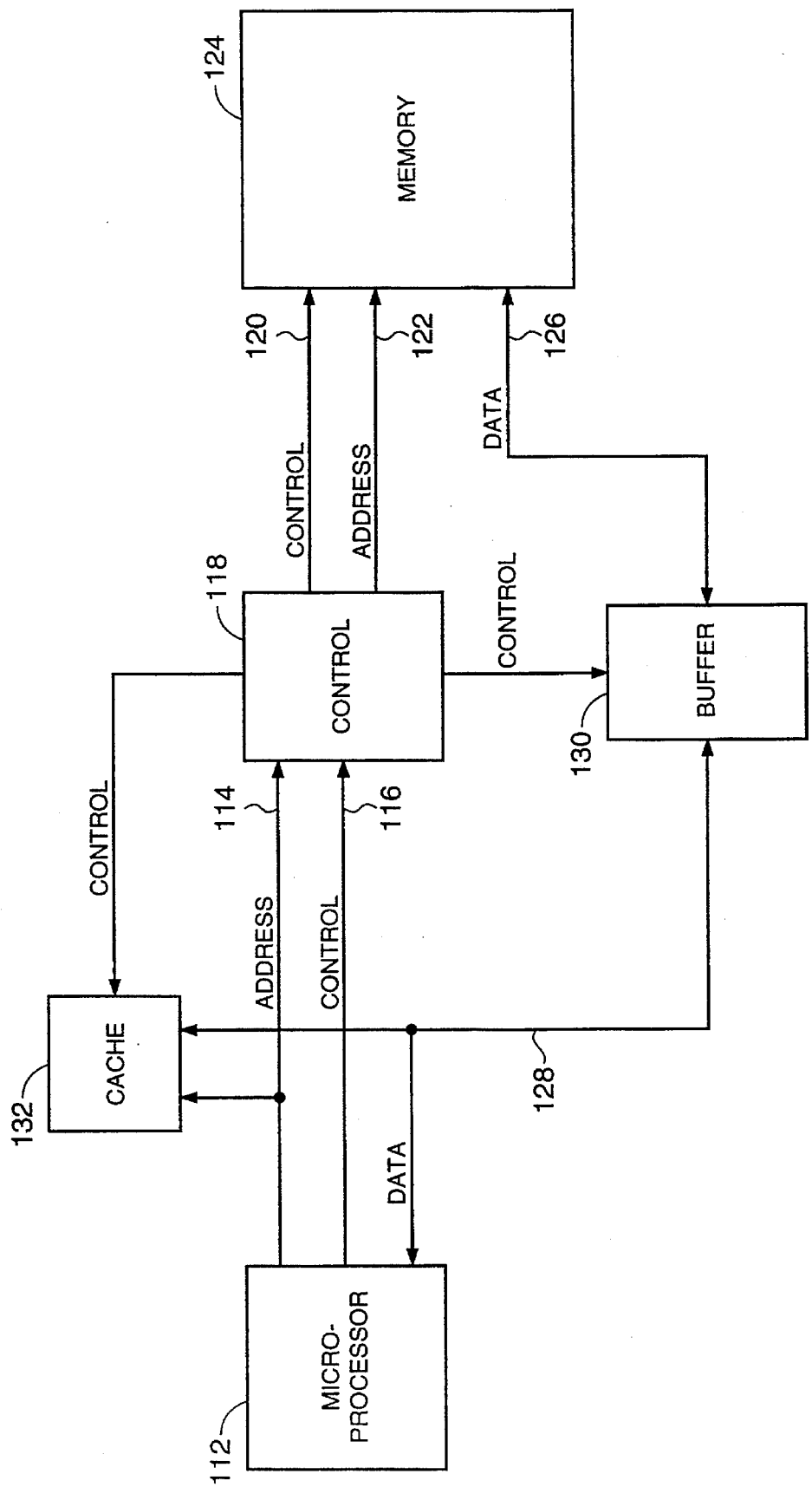
FIG. 11 is a schematic diagram of a computer system designed in accordance with the teachings of the present invention.

FIG. 11 is a schematic representation of a data processing apparatus designed in accordance with the present invention. For the purposes of this specification a microprocessor may be, but is not limited to, a microprocessor, a microcontroller, a digital signal processor, or an arithmetic processor. In FIG. 11, microprocessor 112 is connected via address lines 114 and control lines 116 to a memory control circuit 118. The memory control circuit provides address and control signals on lines 122 and 120 respectively to a burst access memory device 124. The burst access memory device sends and receives data over data bus 126. Optional data bus buffer 130 between memory data bus 126 and microprocessor data bus 128 allows for amplification of the data signals, and/or synchronization with the microprocessor and memory control signals. A fast static random access memory (SRAM) cache circuit 132 is also optional and provides higher speed access to data stored in the cache from the memory circuit or the microprocessor. Memory control circuit 118 may be incorporated within the microprocessor. The memory control circuit provides the required address strobe signals and read/write control signals required for burst mode access of the memory circuit. By providing burst access of the memory by the processor, a computer with relatively high memory bandwidth can be designed without the requirement of a fast SRAM cache. SRAMs which are fast enough to provide memory access without wait states can significantly add to the cost of a computer. Thus the burst access memory device of the present invention allows for medium to high performance computers to be manufactured at a cost which is significantly less than those manufactured today. Use of the burst access memory device of the present invention in cooperation with a fast SRAM cache allows for an even higher performance computer design by providing fast access to main memory in the event of a cache miss.

While the present invention has been described with reference to preferred embodiments, numerous modifications and variations of the invention will be apparent to one of skill in the art without departing from the scope of the invention.

What is claimed is:

1. A memory device adapted to perform a write operation to store data in the memory device, the memory device comprising:

a write operation control circuit adapted to switch control of a write operation between a write command signal and an access cycle signal during a write operation, wherein the write command signal initiates the write operation, and the access cycle signal terminates the write operation.

2. The memory device of claim 1, further comprising an array of memory elements, wherein the access cycle signal is operative to latch an address corresponding to a column of the array and to initiate an access cycle.

3. The memory device of claim 1, wherein said write operation control circuit comprises a multiplexer, said multiplexer producing a multiplexer output to control the write operation.

4. The memory device of claim 3, wherein said write operation control circuit further comprises a latch adapted to drive a latched select signal to said multiplexer to select control of the write operation.

5. The memory device of claim 1, further comprising a write command latch responsive to the access cycle signal and an externally generated write cycle control signal to create the write command signal.

6. The memory device of claim 5, further comprising a circuit to clear said write command latch at the beginning of an access cycle.

7. The memory device of claim 6, wherein said circuit to clear comprises a pulse generator.

8. A memory access cycle control circuit for a memory suitable to perform a write operation to store data in the memory device, the access cycle control circuit comprising:

circuitry to terminate a first write operation in response to initiation of an access cycle by a transition of an access cycle signal;

circuitry to initiate a second write operation in response to the transition of the access cycle signal after termination of the first write operation; and a latch to maintain the second write operation until a subsequent transition of the access cycle signal.

9. A write cycle control circuit for a memory device, comprising:

a write cycle command latch to store a latched write cycle command in response to an access cycle signal, the access cycle signal initiating a memory access cycle; and a pulse generator to clear said write cycle command latch in response to the access cycle signal prior to said write cycle command latch storing the write cycle command.

10. The write cycle control circuit of claim 9, further comprising:

a multiplexer, adapted to produce a write cycle control output signal, to select between the latched write cycle command and the access cycle signal to determine a state of the write cycle control output signal.

11. The write cycle control circuit of claim 9, further comprising:

an access cycle pulse generator to generate an access cycle pulse signal in response to each edge of the access cycle signal, the access cycle pulse signal having a first and a second state within each access cycle which define a first and a second portion of each access cycle.

12. The write cycle control circuit of claim 11, further comprising:

a multiplexer, adapted to produce a write cycle control output signal, to select between the latched write cycle command and the access cycle pulse signal to determine a state of the write cycle control output signal.

13. A method of writing data in a memory device, comprising the following sequence of steps:

intiating a write access cycle of the memory device with an access cycle signal;

clearing a write command latch within the memory device; and latching a write command signal in the write command latch to control the write access cycle.

14. The method of claim 13, furhter comprising steps of:

storing data in response to said step of latching the write command signal;

initiating a further access cycle of the memory device; and terminating said step of storing data in response to said step of initiating the further access cycle.

15. The method of claim 14, wherein said step of storing data occurs throughout a period of time nearly equal to a duration of the write access cycle.

16. The method of claim 14, further comprising a step of:

clearing the write command latch subsequent to said step of terminating.

17. The method of claim 13, further comprising steps of:

storing data in response to said step of latching the write command signal;

initiating a read cycle of the memory device; and terminating said step of storing data in response to said step of initiating the read cycle.

18. The method of claim 17, further comprising:

clearing the write command latch subsequent to said step of terminating.

19. The method of claim 13, further comprising:

storing data in response to said step of latching the write command signal;

terminating a burst access of the memory device; and terminating said step of storing data in response to said step of terminating the burst access.

20. The method of claim 19, further comprising:

clearing the write command latch subsequent to said step of terminating said step of storing.

* * * * *